(12) United States Patent
Haga

(10) Patent No.: US 7,219,426 B2
(45) Date of Patent: May 22, 2007

(54) METHOD OF MANUFACTURING PROTRUDING-VOLUTE CONTACT

(75) Inventor: Tsuyoshi Haga, Hyogo (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 155 days.

(21) Appl. No.: 10/972,514

(22) Filed: Oct. 26, 2004

(65) Prior Publication Data

US 2005/0088193 A1 Apr. 28, 2005

(30) Foreign Application Priority Data

Oct. 27, 2003 (JP) ............... 2003-365596

(51) Int. Cl.
*H01R 43/16* (2006.01)
(52) U.S. Cl. .............. 29/874; 29/882; 29/884; 29/885; 439/66; 439/82
(58) Field of Classification Search ........... 29/825, 29/830, 842–846, 852, 874, 883, 884; 205/70, 205/78; 216/17; 361/715; 378/34; 430/702, 430/711; 439/66, 82, 591; 324/758
See application file for complete search history.

(56) References Cited

U.S. PATENT DOCUMENTS 4,961,709 A * 10/1990 Noschese .............. 439/66
5,297,967 A 3/1994 Baumberger et al.
6,204,455 B1 3/2001 Gilleo et al.
6,517,362 B2 2/2003 Hirai et al.
6,672,876 B1 * 1/2004 Takekoshi .............. 439/66

FOREIGN PATENT DOCUMENTS

| JP | 26-20502 | 3/1997 |
| JP | 2001-235486 A | 8/2001 |
| JP | 2002-175859 A | 6/2002 |
| JP | 2003-078078 A | 3/2003 |

* cited by examiner

*Primary Examiner*—Minh Trinh
*Assistant Examiner*—Donghai D. Nguyen
(74) *Attorney, Agent, or Firm*—McDermott Will & Emery LLP

(57) ABSTRACT

A method of manufacturing a protruding-volute contact for attaining electrical continuity with an electrode of electronic equipment or inspection equipment, the method comprising the steps of forming a plastic mold (resist structure) with a metal mold; forming a layer consisting of metallic material on the plastic mold (resist structure) by means of electroforming; and performing convex formation of a metal microstructure made from the layer consisting of metallic material so as to form a spiral spring that protrudes volutedly outward. With such method, an inspection contact or coupling contact having high reliability and capable of attaining electrical continuity of large electric current can be produced at low cost.

5 Claims, 6 Drawing Sheets

FIG. 3 (a)
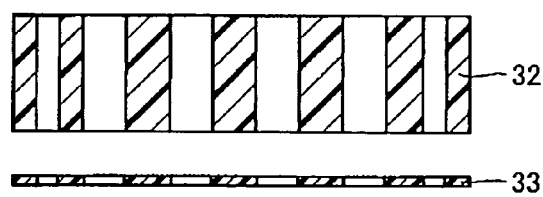
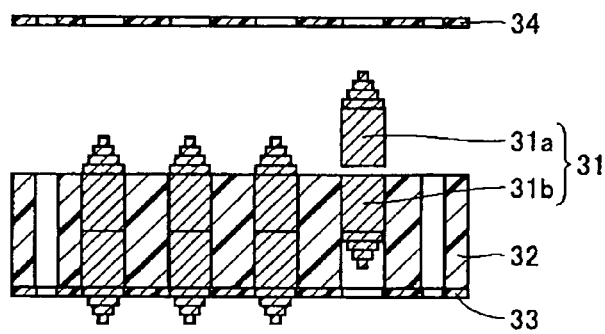
FIG. 3 (b)
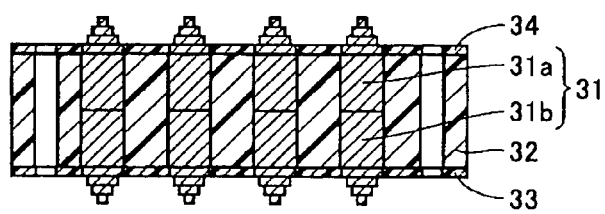
FIG. 3 (c)
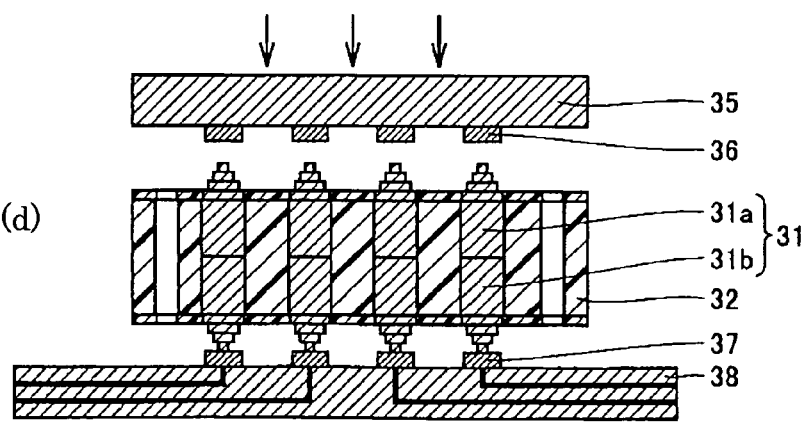
FIG. 3 (d)

METHOD OF MANUFACTURING PROTRUDING-VOLUTE CONTACT

BACKGROUND OF THE INVENTION

1. Field of the Invention

The present invention relates to a contact that is pressed on an electrode of electronic equipment consisting of IC (integrated circuit) or LSI (large scale integrated circuit) in order to take out an electrical signal from the electrode. The invention also relates to inspection equipment and electronic equipment which are equipped with the contact.

2. Description of the Background Art

An inspection socket is used for taking out electrical signals from electrodes of electronic equipment consisting of an IC or LSI through contacts by pressing the contacts onto the electrodes in order to inspect the electrical continuity of the electronic equipment. A connector is used for the purpose of maintaining electrical continuity with electronic equipment such that contacts are pressed on the land electrodes of the electronic equipment so as to maintain electrical continuity with the electronic equipment through the contacts. The inspection socket and connector are provided with a number of contacts corresponding to the number of the electrodes of the electronic equipment to be connected, and higher density mounting corresponding to high density electronic equipment is demanded of the contacts to be provided in the inspection socket and the connector.

For example, a contact for BGA (ball grid array) is one of such known contacts. The contact has a planar spiral shape before contacting a ball electrode, and the spiral shape of the contact changes corresponding to the shape of the ball electrode as a result of contacting with the ball electrode (see Japanese Patent Application Publication No. 2002-175859). It is described therein that this contact can meet high density mounting of electrodes, securing electrical continuity without deforming a ball electrode and being highly reliable.

In the case of using a spiral contact, the sag amount increases as distanced from the tip part of the ball electrode while the sag amount of the spiral is small at the tip part. Accordingly, the bending stress most increases near the root of the spiral contact, where it least tends to bend, and therefore the reliability decreases according to the increase in the mounting density of ball electrodes. A known method to solve such a problem is that the shape of an electrode on the side of electronic equipment is designed to be a circular cone, triangular pyramid, quadrangular pyramid, or the like (see Japanese Patent Application Publication No. 2003-78078).

A known inspection contact is, for example, a contact having a spring of spiral shape in which the coil diameter decreases gradually from an outer periphery to an inner circumference. The contact attains electrical continuity by being pressed on the electrode of electronic equipment (see Japanese Patent Application Publication No. 2001-235486). It is stated that since this contact has a spring of spiral shape, the length thereof becomes short as compared with a spring having a uniform coil diameter and that accordingly, the impedance in the spring part decreases, resulting in the decrease of the attenuation of the electrical signal even in the case of detecting a high frequency electrical signal.

There are various methods for manufacturing these spiral contacts: a method in which a plating method is combined with a lithography method that uses ultraviolet radiation (UV) having a wavelength of about 200 nm; a method using laser, etching or punching; or a mechanical method in which a plate is curled up, etc. However, with the lithography method using UV, or the methods using laser, etching or punching, only spiral contacts having a thickness of about 20 μm or less can be obtained, and consequently the aspect ratio is small. Accordingly, the spring becomes thin if it is attempted to increase a stroke (sag amount of a spiral) in order to obtain a contact having high conduction reliability. Therefore, such contacts cannot conduct an electric current of 0.5 A or more.

Also, because of the small aspect ratio, the number of spirals becomes less, and the contact load decreases when the stroke is attempted to be enlarged, whereas the stroke decreases when the contact load is attempted to be increased. Therefore, only spiral contacts of low coupling reliability are obtained. Moreover, because of a large number of parts such as a spiral contact, interposer board with VIA, etc., the cost of parts increases, and the assembling cost increases because alignment is necessary in the assembling, which results in high cost of the contact. On the other hand, if it is attempted to manufacture a spiral contact by machine processing such as curling up of a plate, there is a limit to miniaturization of the contact, and it is difficult to manufacture a large quantity of precision contacts exactly and with satisfactory reproducibility.

SUMMARY OF THE INVENTION

The present invention was accomplished in view of the above mentioned problems, and an object of the invention is to provide a low cost inspection or coupling contact having high reliability and capable of attaining electrical continuity of large electric current.

A method of manufacturing a protruding-volute contact according to the present invention is a manufacturing method for a contact that is used for attaining electrical continuity with an electrode of electronic equipment or inspection equipment. The method typically includes a process of forming a plastic mold (resist structure) with a metal mold, a process of forming a layer consisting of metallic material in the plastic mold (resist structure) by means of electroforming, and a process of performing convex formation of a metal microstructure made from the layer consisting of metallic material so as to form a spiral spring that protrudes volutedly outward.

Another manufacturing method of a protruding-volute contact of the present invention typically includes a process of forming a plastic mold (resist structure) by X-ray lithography, a process of forming a layer consisting of metallic material in the plastic mold (resist structure) by electroforming, and a process of performing convex formation of a metal microstructure made from the layer consisting of metallic material so as to form a spiral spring that protrudes volutedly outward.

Such manufacturing methods may further include a process of machining one or both faces of the layer consisting of metallic material so that the thickness of the layer consisting of metallic material becomes thinner radially from outer peripheral part to central part. Such machining process may be performed by electrical discharge machining. Such machining process may be performed in a manner such that one or both faces of a metal microstructure made from the layer consisting of metallic material can be in contact with a spherical face or paraboloid of revolution after the machining thereof The contact of the present invention may be manufactured by such methods and may be made of nickel or nickel alloy.

The inspection equipment of the present invention may have a socket equipped with such protruding-volute contacts and may be used for the inspection of semiconductors of land grid array arrangement in particular. On the other hand, the electronic equipment of the present invention may be characterized in that it has a connector equipped with such protruding-volute contacts and is connected with land electrodes.

According to the present invention, an inspection contact or coupling contact with high reliability which can attain electrical continuity of large electric current can be provided at low cost.

BRIEF DESCRIPTION OF THE DRAWINGS

FIGS. 3(a)–3(d) schematically show a process of manufacturing an inspection socket using contacts according to the present invention.

DETAILED DESCRIPTION OF THE INVENTION

Hereinafter, embodiments of the present invention will be described in detail with reference to the accompanying drawings. In the description of the drawings, the same elements will be denoted by the same reference symbols, and redundant description will be omitted.

(Protruding-Volute Contact)

Figure 1:
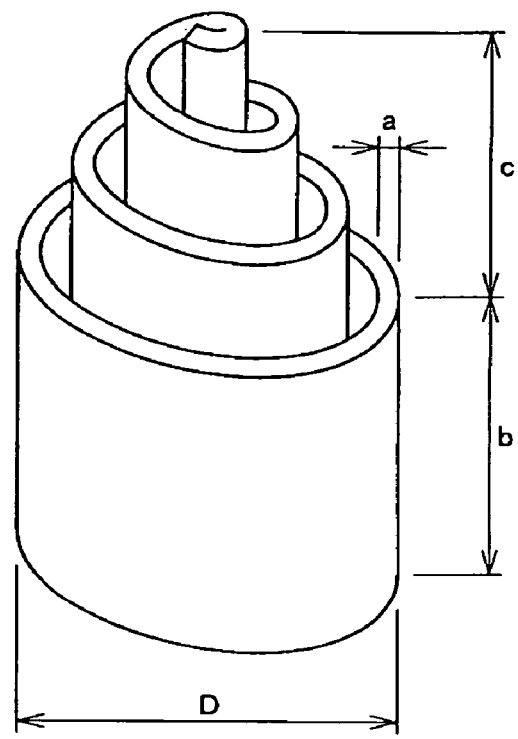
FIG. 1 is a perspective view of a protruding-volute contact of the present invention.

A typical example of the protruding-volute contact of the present invention is shown in FIG. 1. As shown in FIG. 1, a protruding-volute contact of the present invention has a spiral spring structure which is prominent volutedly outside. For example, such protruding-volute contacts are used, in a socket for inspection equipment or a connector mounted in electronic equipment, in a manner in which pairs of contacts 31a and 31b are engaged in the through-holes of a substrate 32, as shown in FIG. 3(d), with their convex spiral portions facing outward and with their end faces of the opposite side being put together. In the case of a socket for inspection equipment, electrical continuity is accomplished between electrodes 36 of an LSI 35 and the electrodes 37 of a transformer former 38 by putting the inspection equipment socket between the LSI 35 and the transformer former 38 located on the measurement equipment side such that a moderate contact load is generated by the additive force of the spiral springs of the contacts 31. Thus, electrical signals obtained from the LSI 35 are led to the measuring instrument via the transformer former 38 through contacts 31. Therefore, the protruding-volute contacts of the present invention are useful as contacts of a socket for inspection equipment used for inspecting a semiconductor of land grid array arrangement, and the like. Moreover, the protruding-volute contacts of the present invention are useful as contacts of a connector for electronic equipment to be connected with land electrodes of communication apparatus such as a mobile phone or electronic equipment such as a personal computer.

The spiral spring of the protruding-volute contact preferably has a thickness that becomes thinner radially from the outer peripheral part to the central part. If the thickness and the width of the spiral spring are uniform, the stiffness of the spiral spring is larger at an inner part than at an outer part because the radius of curvature is less at a position closer to the center. However, if the thickness of the spiral spring of the protruding-volute contact is designed to be thinner at a position closer to the central part, the stiffness becomes equal at any part, and consequently the whole of the spring exhibits uniform and efficient performance. Also, the stiffness can be made uniform by making the width of the spiral spring to be shorter at a position closer to the central part. However, such a spiral spring has a shortcoming in that the outer peripheral part becomes thicker, and accordingly the number of spirals becomes less such that the stroke decreases. Therefore, a preferable embodiment of the present invention is such that the thickness is designed to be thinner at a position closer to the central part.

Preferably, the electrodes of inspection equipment or electronic equipment are structured in a form of a board, since sure contact between the protruding-volute contacts and the electrodes is thereby achieved. However, the protruding-volute contacts can be used for electrodes having an uneven face, such as a depressed or protruded face.

Figure 6:
FIGS. 6(a)–6(c) show cross-sections of contacts of the present invention, showing cross-sections cut perpendicularly relative to a longitudinal direction.
Figure 6:
Figure 6:
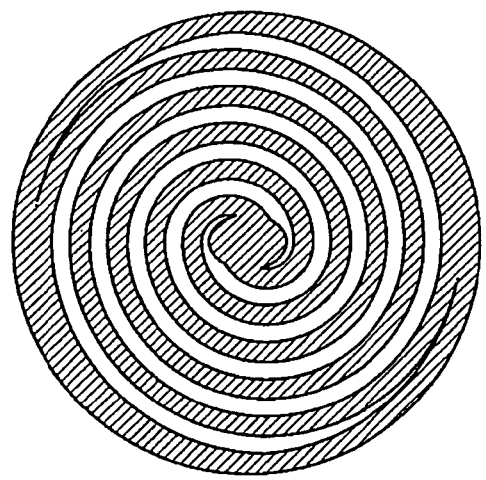

The contact shown in FIG. 1 has a cross-section of approximately circular shape when cut in a plane perpendicular to a longitudinal direction. However, the shape of the contact of the present invention is not limited to such a circular shape; it may be a circular shape having a partly warped circumference, or an elliptical shape, or a polygonal shape, such as triangle, square, etc. The polygonal shape may have sides of different length, not limited to a regular polygon. FIG. 6 shows contacts of various modes of circular shape in a case where they are cut in a plane perpendicular to a longitudinal direction. They are all included in the scope of the present invention. The example shown in FIG. 6(a) consists of one arm. The examples shown in FIGS. 6(b) and 6(c) consist of two arms. In the example of FIG. 6(b), the tip is not connected, but in the example of FIG. 6(c), the tip is connected in the central part.

(Method of Manufacturing a Protruding-Volute Contact)

The method of the present invention for manufacturing the protruding-volute contact typically includes a process of forming a plastic mold (resist structure) by X-ray lithography, a process of forming a layer consisting of metallic material by electroforming on the plastic mold (resist structure), and a process of forming a spiral spring protruding volutedly outward by performing convex formation of a metal microstructure made from the layer consisting of metallic material. With such method, an inspection contact having high reliability and capable of attaining electrical continuity of large electric current can be produced at low cost.

In the manufacturing method of the present invention, X-rays (wavelength of 0.4 nm) which are shorter wavelength than UV (wavelength of 200 nm) are used because a contact having a high aspect ratio can thereby be obtained. In particular, synchrotron X rays (hereinafter, called "synchrotron radiation") having higher directivity among the X-rays are preferably used. With LIGA (Lithographie Galvanoformung Abformung) process which uses synchrotron radiation, deep lithography is possible, and it is possible to produce metal microstructures having a height of several hundreds μm order with precision of micron order and in large quantities.

With a method in which X-rays and electroforming are used in combination, contacts having an aspect ratio (b/a) equal to or more than 2 as shown in FIG. 1 can be easily manufactured, and it is possible to manufacture contacts having an aspect ratio equal to or more than 30. Since a high aspect ratio can be obtained, it is possible to make the thickness b to be thick even if the width a of a spring is designed to be thin, and it is possible to produce contacts exhibiting high contact strength and high contact reliability. Accordingly, a large permissible electrical current equal to or more than 0.5 A can thereby be secured. Moreover, since the width "a" of the spring can be thin, the number of spirals can be increased. Accordingly, it is possible to produce spiral contacts exhibiting a large stroke of the spring. Thus, even if the stroke is made large, the contact load does not decrease. More specifically, contacts having a spiral spring of two or more spirals can easily be manufactured, and it is possible to manufacture contacts having a spiral spring of four or more spirals in order to enhance a stroke. It is possible to easily produce contacts having a stroke of 100 μm or more and a contact load of 0.03 N. Moreover, contacts having a contact load of 0.1 N or more can also be manufactured.

In an attempt to manufacture a spiral contact by machining process such as curling up of a plate, there is a limit to miniaturization of the contact, and a possible smallest spiral contact that can be made by such machining process will have a thickness b of 1000 μm and a diameter D of about 500 μm–1000 μm. With this size, it is difficult to comply with high density packaging of semiconductors. It is also difficult to manufacture precision contacts in large quantities, precisely with satisfactory reproducibility.

According to the present invention, it is possible to comply with the high density packaging of electronic equipment since contacts having a thickness b of 50 μm–500 μm, a diameter D of 100 μm–500 μm, and an amount of protrusion c of 100 μm or more can easily be manufactured precisely with satisfactory reproducibility and in large quantities. Moreover, because of the manufacturing method in which lithography and electroforming are combined, the metal microstructure can be formed integrally, the number of parts can be decreased, and the part cost and assembling cost can be reduced.

Figure 4:
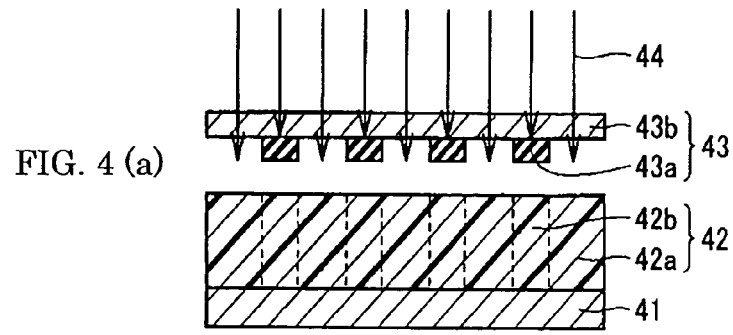
FIGS. 4(a)–4(f) schematically show a process of manufacturing a contact of the present invention.
Figure 4:
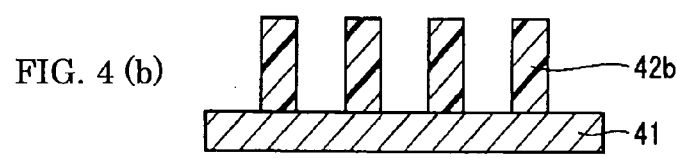
Figure 4:
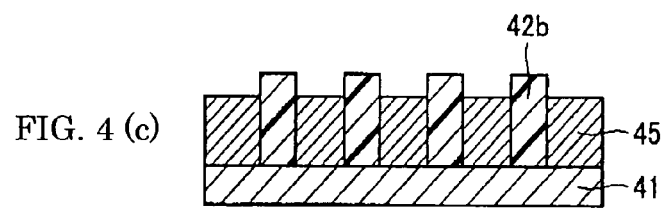
Figure 4:
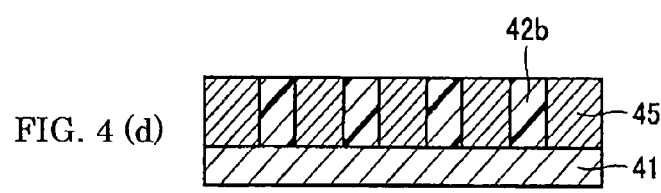
Figure 4:
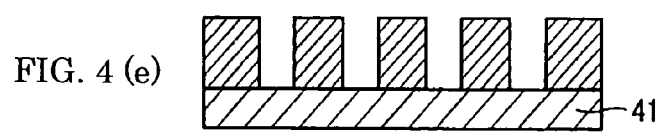
Figure 4:

In the manufacturing method of the present invention, a resin layer 42 is formed on an electroconductive substrate 41 as shown in FIG. 4(a). The electroconductive substrate is, for example, a substrate made of metal such as copper, nickel, or stainless steel, or a silicon substrate to which a metallic material such as chrome or titanium is applied by sputtering. The resin layer is made of a resin material containing polyester methacrylate such as polymethyl methacrylate (PMMA) as a main component, or chemical amplification type polymer material having susceptibility to X-rays, or the like. The thickness of the resin layer can be optionally set according to the thickness of the contact to be formed; for example, it can be designed to be 50 μm–500 mm.

Next, a mask 43 is arranged on the resin material 42, and X-rays 44 are irradiated thereto through the mask 43. Preferably, the X-ray is synchrotron radiation. The mask 43 consists of an X-ray absorption layer 43a formed according to the pattern of the contact and an optically transparent substrate material 43b. The optically transparent substrate material 43b is made of silicon nitride, silicon, diamond, titanium or the like. The X-ray absorber layer 43a is made of a heavy metal such as gold, tungsten, or tantalum, or a compound thereof, or the like. A resin layer portion 42a of the resin layer 42 is exposed to the irradiation of X-rays 44, and its quality changes, but a resin layer portion 42b is not exposed because of the X-ray absorber layer 43a. Therefore, only the part in which the quality has changed because of the X-rays 44 is removed by the development and consequently a plastic mold (resist structure) 42b as shown in FIG. 4(b) is obtained.

Figure 2:
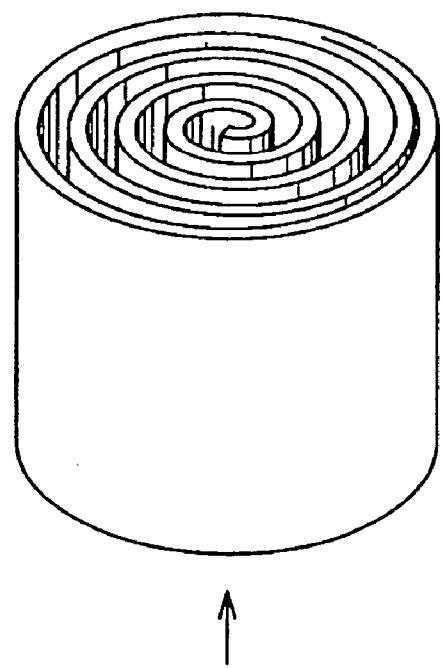
FIG. 2 is a perspective view of a metal microstructure before processing a central part by pressing.

Next, a metallic material 45 is deposited by electroforming in the plastic mold (resist structure) 42b as shown in FIG. 4(c). The electroforming means that a layer consisting of a metallic material is formed, using a metallic ion solution, on an electroconductive substrate. The metallic material 45 can be deposited in the plastic mold (resist structure) 42b by electroforming using the electroconductive substrate 41 as a seed layer. In a case where the metallic material is deposited to a degree in which the space of the plastic mold (resist structure) is substantially buried, the contact of the present invention can be obtained ultimately from the accumulated metallic material layer. In a case where the metallic material is deposited in the plastic mold (resist structure) beyond the height of the plastic mold (resist structure), a metal microstructure obtained by removing the plastic mold (resist structure) and the substrate has a space formed as a result of the removal of the plastic mold (resist structure). The metal microstructure thus obtained can be used as a mold in the method of manufacturing a contact according to the present invention as described later. Nickel, copper or their alloy is used as the metallic material, and particularly nickel or a nickel alloy such as nickel manganese is preferable from the viewpoint of enhancing the wear resistance of the contact. After electroforming, the thickness is adjusted to a predetermined measure by polishing or machining (FIG. 4(d)), and thereafter the plastic mold (resist structure) 42b is removed by wet etching or plasma etching as shown in FIG. 4(e). Subsequently, wet etching is performed with acid or alkali, or mechanical processing is performed to remove the electroconductive substrate 41, and thereby a metal microstructure of the present invention as shown in FIG. 4(f) can be obtained. The perspective view of this metal microstructure is shown in FIG. 2. A spiral spring structure protruding volutedly outward is formed as a result of convex formation performed by pressing the metal microstructure in a direction shown by the arrow in FIG. 2. Thus, a contact of the present invention as shown in FIG. 1 is obtained. A simple method of convex formation is, for example, a method in which outside force is applied to the central part in the direction of the arrow as in FIG. 2 so as to make plastic deformation, and thereafter, a heat treatment is performed at 100° C.–350° C. for 5 hours–40 hours in order to release a processing stress. The contact thus obtained is provided with a gold coating with a thickness of 0.05 μm–1 μm according to need in order to enhance electrical continuity with an electrode of electronic equipment, or the like.

Preferably, one or both faces of the metal microstructure made from the above-mentioned metallic material layer are machined so that the thickness thereof becomes thinner from the outer peripheral part to the central part. In the spiral spring, the radius of curvature is smaller at the central part, and accordingly, if the width and the thickness of the arm are constant, the closer to the central part, the more the stiffness. Therefore, in the case of a spiral spring made of one arm having a uniform width and thickness, the stress tends to be centered on the root part of the arm during the convex formation process. Therefore, the stiffness becomes uniform at any position of the arm and uniform convex formation can be made easily if one or both faces of the spiral spring are machined so that the thickness becomes thinner at a position closer to the central part such that one or both faces can be in contact with a spherical face or paraboloid of revolution, for example. If the thickness of the central part of the spiral spring is designed to be thinner so as to provide a concavity, a stick for pushing the central part tends to move toward the central part during convex formation, and accordingly the convex formation can be achieved, with rarely being bent even in the case of a metal microstructure like a contact of the present invention.

Figure 7:
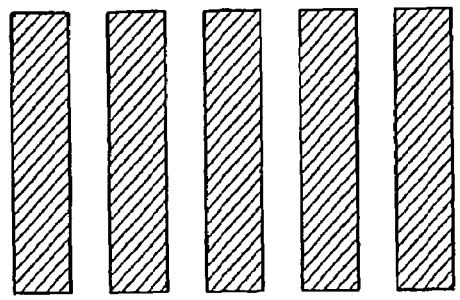
FIGS. 7(a)–7(d) are sectional views of contacts of the present invention, showing cross-sections cut in a longitudinal direction.
Figure 7:
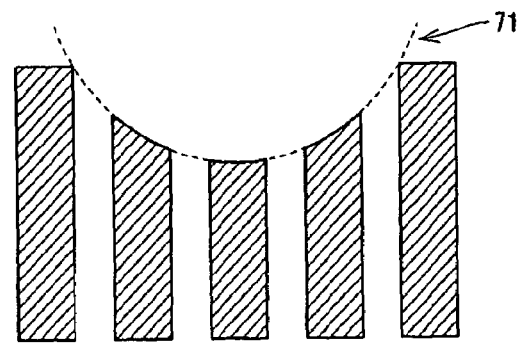
Figure 7:
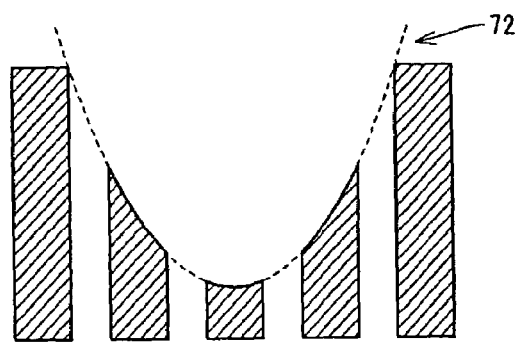
Figure 7:
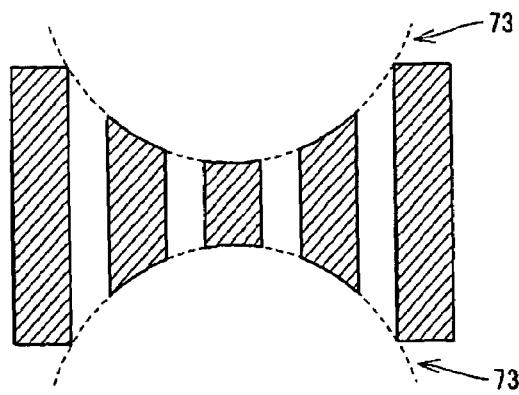

The sectional views of contacts according to the present invention are shown in FIGS. 7(a) to 7(d). FIG. 7(a) shows an example of uniform thickness. FIGS. 7(b) and 7(c) show examples in which the thickness is made thinner toward the central part by processing of one face. In the example of FIG. 7(b), the processed face is in contact with a spherical face 71. In the example of FIG. 7(c), the processed face is in contact with a paraboloid of revolution 72. In the example of FIG. 7(d), the thickness is made thinner toward the central part by processing of both faces, and both faces are in contact with a spherical face 73, respectively. Such a bowl-shaped concavity can be formed by machining, etching, or electrical discharge machining, or the like, and from the viewpoint of preciseness, electrical discharge machining is preferable. The electrical discharge machining is performed, for example, in the following manner: the tip of the electrode to be used for electrical discharge machining is processed into a shape of a hemisphere or paraboloid of revolution; and in the case of manufacturing a contact by the above-mentioned method, after electroforming, preferably the metallic layer on the substrate is machined by the electrode whose tip is thus processed, before removing a plastic mold (resist structure) by etching (FIG. 4(d), FIG. 5(f)) or after such removing (FIG. 4(e), FIG. 5(g)). A plurality of contacts can be processed together at the same time using an electrode-type mold. In the case of processing both faces, processing can be made similarly after separating the metallic layer from the substrate.

FIGS. 3(a) to 3(d) show a method of manufacturing an inspection socket from the contacts thus obtained. A connector for mounting can also be manufactured by a similar method. The manufacturing method for the inspection socket or the connector for mounting is not limited to the method shown in FIGS. 3(a) to 3(d). However, such manufacturing method shown in the figures is preferable from the viewpoint of ease in the manufacture. First, as shown in FIG. 3(a), through-holes are formed in a substrate 32, according to the outer diameter of the contacts which are to be accommodated therein, at the positions corresponding to the electrodes of electronic equipment or the electrodes of a semiconductor to be inspected. Subsequently, holes having a diameter smaller than the outer diameter of the contacts to be accommodated are formed in a lower-lid sheet 33 similarly at the positions corresponding to the arrangement of the electrodes, and the lower-cover sheet 33 is attached to the substrate 32. Thereafter, a pair of contacts 31a and 31b, which are put together opposing each other with their respective convex portion of spiral shape facing outward, are engagedly put into each of the through-holes of substrate 32 as shown in FIG. 3(b). Subsequently, an upper-cover sheet 34 similar to the lower-cover sheet 33 is attached to the substrate 32. Thus, contacts 31 are fixed, and an inspection socket or a connector for mounting according to the present invention as shown in FIG. 3(c) is obtained. The material of the substrate 32, lower-cover sheet 33, and upper-cover sheet 34 is selected optionally from the group of polyimide resin, general fiber reinforced plastic (FRP), and the like.

The method of manufacturing a contact according to another embodiment of the present invention includes a process of forming a plastic mold (resist structure) with a metal mold, and a process of forming a layer consisting of metallic material in the plastic mold (resist structure) by electroforming, and a process of forming a spiral spring in a shape protruding volutedly outward by applying convex formation to a metal microstructure made from the layer consisting of metallic material. With such method also, as in the case of the above-mentioned manufacturing method in which a plastic mold (resist structure) is formed by X-ray lithography, it is possible to fabricate at low cost an inspection contact or coupling contact exhibiting high reliability and capable of attaining electrical continuity of large electric current. It is advantageous in that a mass production of contacts using the same mold is possible.

With such manufacturing method, a depressed plastic mold (resist structure)53 as shown in FIG. 5(b) is formed by press or injection molding or the like using a mold 52 having a protruding spiral portion as shown in FIG. 5(a). Thermoplastic resins, including acrylic resins such as polymethyl methacrylate, polyurethane resin, polyacetal resins such as polyoxymethylene, are used as the material of the plastic mold (resist structure). As for the mold 52, since it is a metal microstructure similar to the contact of the present invention, it is formed preferably by the above-mentioned method in which an X-ray lithography method and electroforming are combined.

Figure 5:
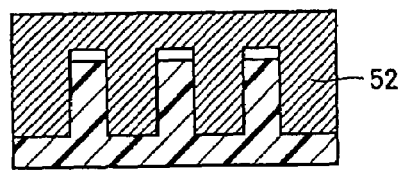
FIGS. 5(a)–5(h) show another process of manufacturing a contact of the present invention.
Figure 5:
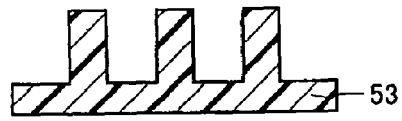
Figure 5:
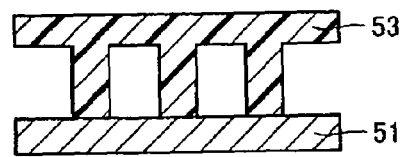
Figure 5:
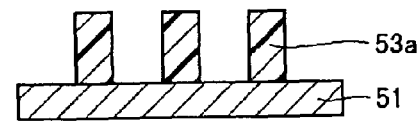
Figure 5:
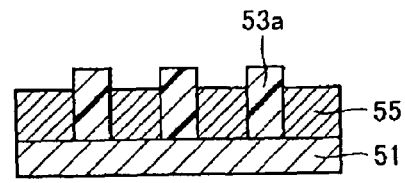
Figure 5:
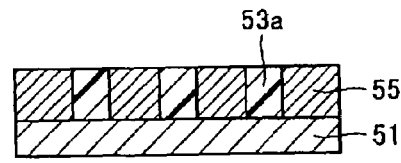
Figure 5:
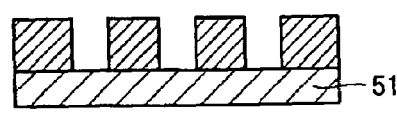
Figure 5:

Next, after reversing the top and the bottom of the plastic mold (resist structure) 53, it is attached on the electroconductive substrate 51 as shown in FIG. 5(c). Subsequently, the plastic mold (resist structure) 53 is polished to form a plastic mold (resist structure) 53a as shown in FIG. 5(d). Thereafter, the same as described above, a metallic material 55 is deposited to the plastic mold (resist structure) 53a by electroforming (FIG. 5(e)), the thickness is adjusted (FIG. 5(f)), the plastic mold (resist structure) 53a is removed (FIG. 5 (g)), and the electroconductive substrate 51 is removed, and thereby a metal microstructure as shown in FIG. 5(h) and FIG. 2 is obtained. Subsequently, a spiral spring protruding volutedly outward is formed by convex formation, and thereby a contact of the present invention as shown in FIG. 1 is obtained. Then, by the same method as described above, a socket for inspection equipment or a connector for electronic equipment is obtained from such contacts.

EXAMPLE 1

First, a resin layer 42 was formed on an electroconductive substrate 41 as shown in FIG. 4(a). A silicon substrate made by sputtering titanium was used as the electroconductive substrate. The material for forming a resin layer was a copolymer of methyl methacrylate and methacrylic acid, and the thickness of the resin layer was 200 μm.

Next, a mask 43 was arranged on the resin layer 42, and X-rays 44 were irradiated through the mask 43. As for the X-ray, synchrotron radiation by SR equipment was adopted. The mask 43 had an X-ray absorber layer 43a corresponding to the pattern of the contact, and an optically transparent substrate material 43b of the mask 43 was consisted of silicon nitride, and the X-ray absorber layer 43a was made of tungsten nitride.

After the irradiation of X-rays 44, development was performed by methyl isobutyl ketone, and the part in which the quality has been changed by the X-rays 44 was removed.

As a result, a plastic mold (resist structure) 42b as shown in FIG. 4(b) was obtained. Then, as shown in FIG. 4(c), a metallic material 45 was deposited by electroforming in the space of the plastic mold (resist structure) 42b. Nickel was used as the metallic material.

After the electroforming was completed, the unevenness of the surface was eliminated by polishing as shown in FIG. 4(d), and the plastic mold (resist structure) 42b was removed by oxygen plasma as shown in FIG. 4(e). Subsequently, the electroconductive substrate 41 was removed by wet etching with KOH solution. Thus, a continuous metal microstructure as shown in FIG. 4(f) was obtained. The perspective view of this metal microstructure is shown in FIG. 2. Next, the outer peripheral part of the metal microstructure was fixed and convex formation was made by plastic deformation in which the central part of the metal microstructure was pressed in the direction of the arrow as shown in FIG. 2 and the processing stress was released by heat treatment. Thereafter, gold coating of 0.1 μm thickness was done. Thus, a contact of the present invention having a spiral spring which protrudes volutedly outward as shown in FIG. 1 was obtained. The contacts thus obtained had a diameter D of 300 μm and a thickness b of 150 μm. The thickness a of the spring was 10 μm and the aspect ratio (b/a) was 15. The amount of protrusion c was 150 μm, the number of spirals was 3.5 turns, and the stroke of the spring was 120 μm.

Subsequently, the lower-cover sheet 33 and the substrate 32, which have through-holes corresponding to the position of the electrodes of a semiconductor (LSI) to be inspected, were attached together as shown in FIG. 3 (a). The substrate 32 was made of a polyimide resin, and had the thickness of 300 μm and through-holes having a diameter of 300 μm. Also, the lower-cover sheet 33 was made of a polyimide resin, and had the thickness of 20 μm, in which holes having a diameter of 250 μm were formed at the positions corresponding to the through-holes of substrate 32.

Thereafter, one pair of contacts 31a and 31b, which were put together opposing each other with the convex portion of spiral shape facing outward as shown in FIG. 3(b), were inserted engagedly into the respective through-holes of the substrate 32. Then, the upper-cover sheet 34 similar to the lower-cover sheet 33 was attached to the substrate 32. Thus, the contact 31 was fixed, and an inspection socket of the present invention as shown in FIG. 3(c) was obtained.

The inspection socket thus obtained was loaded on the electrodes 37 of the transformer former 38 of the inspection equipment as shown in FIG. 3(d), and an LSI 35 to be inspected was put on the inspection equipment. When a pressure of 70 mN force was applied in this state in the direction indicated by the arrows as shown in FIG. 3(d), electrical continuity was attained between flat board-shaped electrodes 36 of LSI 35 and electrodes 37 on a transformer 38 because of the additive force of the spiral spring, and the LSI could be inspected based on electrical signals thereby obtained.

In this example, the diameter D of the contact was 300 μm. However, it was found that a contact having a diameter D of about 100 μm could be fabricated by the method of the present invention, and such contact would further be able to comply with the high density packaging of electronic equipment.

It should be noted that the embodiments and the example disclosed in this specification are exemplary in all respects and that the present invention is not limited to them. It is intended that the scope of the present invention be shown by the claims rather than the description set forth above and include all modifications and equivalents to the claims.

According to the present invention, it is possible to provide inspection equipment or electronic equipment having low-cost contacts exhibiting high reliability and capable of attaining electrical continuity of large electric current.

What is claimed is:

1. A method of manufacturing a protruding-volute contact for attaining electrical continuity with an electrode of electronic equipment or inspection equipment, the method comprising the steps of:

forming a resist structure by X-ray lithography;

forming a layer consisting of metallic material on the resist structure by means of electroforming;

machining one or both faces of said layer consisting of metallic material so that the thickness of said layer consisting of metallic material becomes thinner from the outer peripheral part to the central part in a radial direction; and performing convex formation of a metal microstructure made from the layer consisting of metallic material so as to form a spiral spring that protrudes volutedly outward.

2. A method of manufacturing a protruding-volute contact according to claim 1, wherein said step is performed by electrical discharge machining.

3. A method of manufacturing a protruding-volute contact according to claim 2, wherein said machining process is performed in a manner such that one or both faces of said layer consisting of metallic material can be in contact with a spherical face or paraboloid of revolution.

4. A method of manufacturing a protruding-volute contact according to claim 1, wherein said machining process is performed in a manner such that one or both faces of said layer consisting of metallic material can be in contact with a spherical face or paraboloid of revolution.

5. A method of manufacturing a protruding-volute contact according to claim 1, wherein said protruding-volute contact is made of nickel or nickel alloy.

* * * * *